(12) United States Patent
Hirao et al.

(10) Patent No.: US 12,184,189 B2
(45) Date of Patent: Dec. 31, 2024

(54) POWER CONVERSION DEVICE

(71) Applicant: Hitachi Astemo, Ltd., Hitachinaka (JP)

(72) Inventors: Takashi Hirao, Tokyo (JP); Takeshi Tokuyama, Tokyo (JP); Noriyuki Maekawa, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 216 days.

(21) Appl. No.: 17/911,914

(22) PCT Filed: Jan. 15, 2021

(86) PCT No.: PCT/JP2021/001186
§ 371 (c)(1),
(2) Date: Sep. 15, 2022

(87) PCT Pub. No.: WO2021/199578
PCT Pub. Date: Oct. 7, 2021

(65) Prior Publication Data
US 2023/0135773 A1    May 4, 2023

(30) Foreign Application Priority Data
Mar. 30, 2020    (JP) .................. 2020-061454

(51) Int. Cl.
*H02M 1/08*    (2006.01)
*H02M 1/14*    (2006.01)
(Continued)

(52) U.S. Cl.
CPC ............. *H02M 7/003* (2013.01); *H02M 1/08* (2013.01); *H02M 1/143* (2013.01); *H02M 1/327* (2021.05); *H05K 7/20927* (2013.01)

(58) Field of Classification Search
CPC ........ H02M 7/003; H02M 1/327; H02M 1/08; H02M 1/143; H05K 7/20927
See application file for complete search history.

(56) References Cited

U.S. PATENT DOCUMENTS 9,425,707 B2 * 8/2016 Mutsuura .............. H02M 7/003
2014/0369099 A1 * 12/2014 Asako ................ H05K 7/20927
                                                                          363/97

(Continued)

FOREIGN PATENT DOCUMENTS

JP       2013-251991 A    12/2013
JP       2017-28747 A    2/2017
(Continued)

OTHER PUBLICATIONS

International Search Report (PCT/ISA/210) issued in PCT Application No. PCT/JP2021/001186 dated Apr. 6, 2021 with English translation (four (4) pages).

(Continued)

*Primary Examiner* — Adolf D Berhane
(74) *Attorney, Agent, or Firm* — Crowell & Moring LLP (57) ABSTRACT

A power conversion device can be miniaturized.
A power conversion device includes a power module that performs switching operation, a smoothing capacitor that smooths a voltage ripple caused by the switching operation, a circuit board that controls driving of the power module, a housing that accommodates the power module and the smoothing capacitor, a first fixing member for fixing the power module to the housing, and a second fixing member for fixing the smoothing capacitor to the housing. The circuit board straddles between the power module and the smoothing capacitor, and is fixed by the first fixing member and the second fixing member.

6 Claims, 6 Drawing Sheets

(51) Int. Cl.
*H02M 1/32* (2007.01)
*H02M 7/00* (2006.01)
*H05K 7/20* (2006.01)

(56) References Cited

U.S. PATENT DOCUMENTS

2015/0340966 A1    11/2015   Mutsuura et al.
2016/0294301 A1    10/2016   Yokoyama et al.
2022/0338370 A1*   10/2022   Hirao .................... H02K 11/33

FOREIGN PATENT DOCUMENTS

| JP | 2017-108524 A | 6/2017 |
| JP | 2017-221003 A | 12/2017 |
| JP | 2018-107949 A | 7/2018 |
| WO | WO 2015/075976 A1 | 5/2015 |

OTHER PUBLICATIONS

Japanese-language Written Opinion (PCT/ISA/237) issued in PCT Application No. PCT/JP2021/001186 dated Apr. 6, 2021 (five (5) pages).

* cited by examiner

POWER CONVERSION DEVICE

TECHNICAL FIELD

The present invention relates to a power conversion device.

BACKGROUND ART

Power conversion devices are used by being incorporated in various systems, and required specifications of the power conversion device are becoming stricter with an increase in demand. In Patent Literature 1, a power conversion device in which components of a power conversion circuit including switching elements, smoothing capacitors, and circuit boards on which drive circuit components for driving the switching elements are mounted are accommodated in a housing and in which input power is converted and outputted via high-voltage terminals is disclosed. In the power conversion device, the high-voltage terminals and the circuit boards are arranged in the same plane region.

CITATION LIST

Patent Literature

PTL 1: WO 2015/075976 A

SUMMARY OF INVENTION

Technical Problem

In the invention described in Patent Literature 1, there is room for improvement in miniaturizing of the power conversion device.

Solution to Problem

A power conversion device according to a first aspect of the present invention includes: a power module that performs switching operation; a smoothing capacitor that smooths a voltage ripple caused by the switching operation; a circuit board that controls driving of the power module; a housing that accommodates the power module and the smoothing capacitor; a first fixing member for fixing the power module to the housing; and a second fixing member for fixing the smoothing capacitor to the housing, wherein the circuit board straddles between the power module and the smoothing capacitor, and is fixed by the first fixing member and the second fixing member.

Advantageous Effects of Invention

According to the present invention, the power conversion device can be miniaturized.

DESCRIPTION OF EMBODIMENTS

First Embodiment

A first embodiment of a power conversion device according to the present invention will be described hereinafter with reference to FIGS. 1 and 2.

Figure 1:
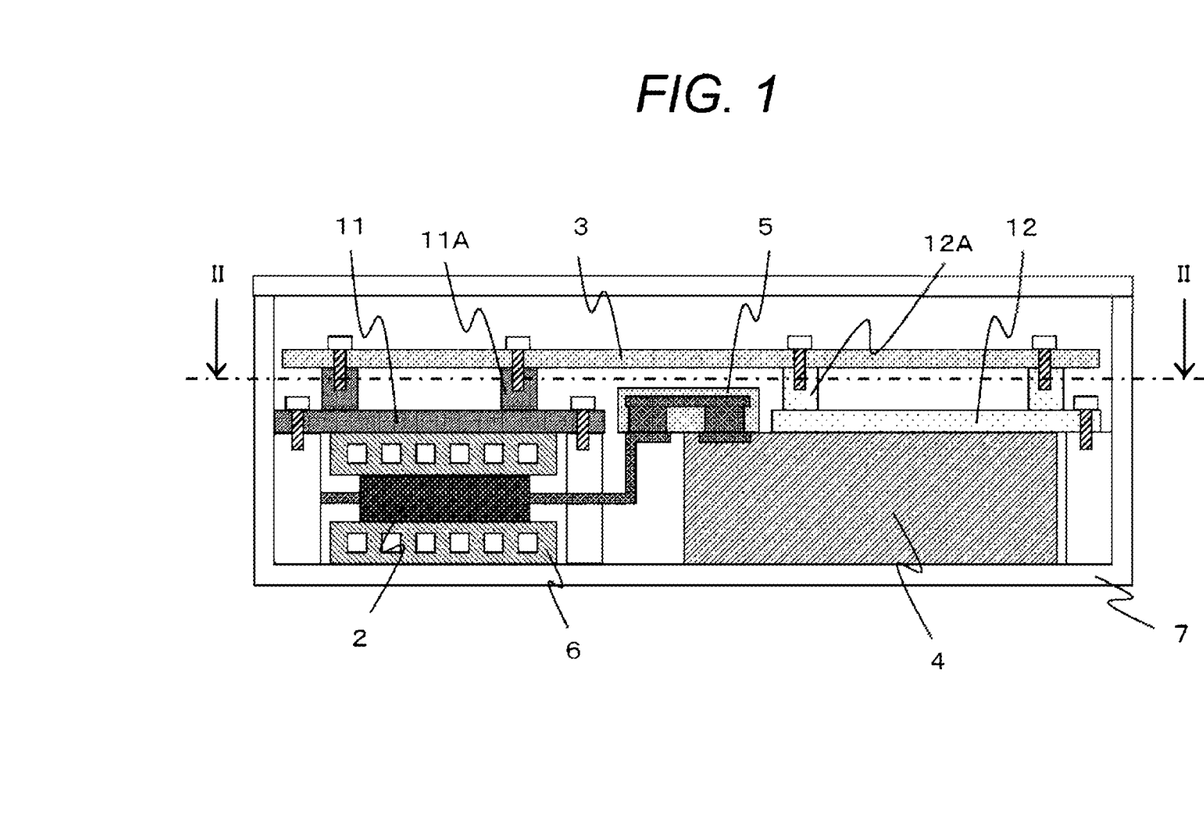
FIG. 1 is a cross-sectional view of a power conversion device 1.
Figure 2:
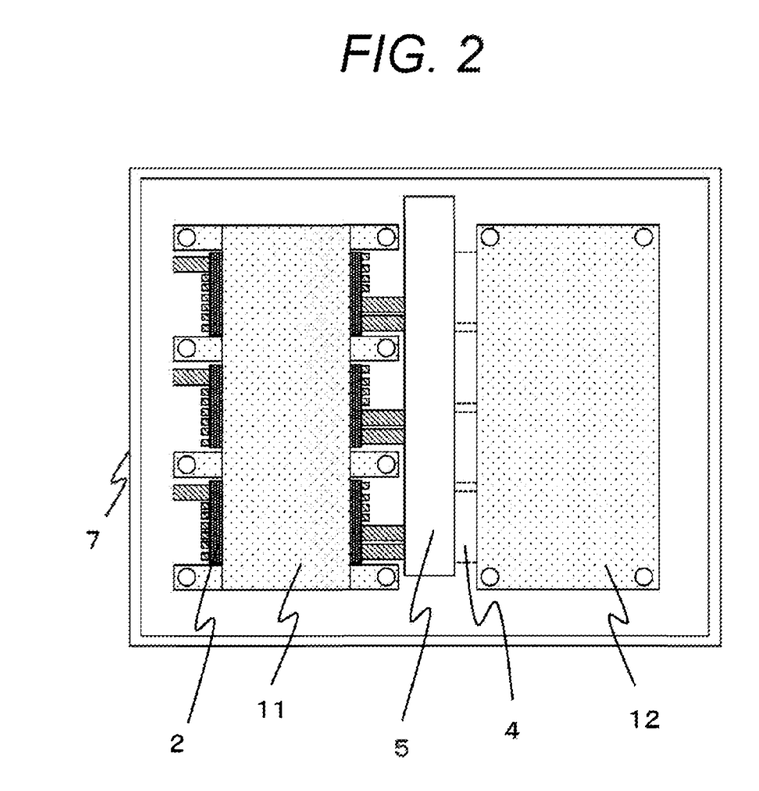
FIG. 2 is a cross-sectional view taken on line II-II in FIG. 1.

FIG. 1 is a cross-sectional view of a power conversion device 1, and FIG. 2 is a cross-sectional view taken on line II-II in FIG. 1. The power conversion device 1 includes power modules 2, a circuit board 3, smoothing capacitors 4, a bus bar 5, channel forming bodies 6, a housing 7, a first fixing member 11, and a second fixing member 12.

The power conversion device 1 executes at least one of a conversion from a direct current to an alternating current, a conversion from the alternating current to the direct current, a frequency conversion, and a voltage conversion by switching operation of power semiconductor elements incorporated in the power module 2. The power module 2 is a module incorporating the power semiconductor elements such as insulated gate bipolar transistors (IGBT) each of using silicon as a base material or metal-oxide semiconductor field effect transistors (MOSFET) each of using silicon carbide as a base material. Since the power module 2 generates a large amount of heat, the power module 2 is cooled by a cooling medium to be described later.

The circuit board 3 is, for example, a printed-circuit board. The circuit board 3 is a board on which a gate drive circuit for driving gates of the power module 2, a microprocessor for calculating various functions, and peripheral circuits of the microprocessor are mounted. The circuit board 3 tends to be affected by noise from the power modules 2 and the smoothing capacitors 4. In particular, the microprocessor mounted on the circuit board 3 is susceptible to the noise. The smoothing capacitor 4 is, for example, a film capacitor or an electrolytic capacitor. The smoothing capacitor 4 smooths voltage ripples caused by switching of the power semiconductors incorporated in the power module 2.

The bus bar 5 is a plate shaped conductor for electric wiring, and a material of the bus bar 5 is copper or aluminum. The bus bar 5 electrically connects the power modules 2 and the smoothing capacitors 4. Wiring lines having different potentials in the bus bar 5 are insulated from each other by resin or the like. The channel forming body 6 is a path through which the cooling medium such as a long life coolant flows. The channel forming body 6 is made of aluminum or resin. The channel forming bodies 6 are arranged so as to sandwich the power modules 2, and the cooling medium flowing inside the channel forming body 6 cools the power modules 2. The housing 7 accommodates members such as the power modules 2 and the smoothing capacitors 4. A material of the housing 7 is aluminum.

The first fixing member 11 presses and fixes the power modules 2 to the housing 7. The first fixing member 11 has a flat plate shape and is made of an electric conductive material such as aluminum or iron. The first fixing member 11 supports the circuit board 3 together with the second fixing member 12. The first fixing member 11 preferably has an elastic force like a leaf spring, and reliably fixes the power modules 2 by having the elastic force. It is to be noted that first bosses 11A are disposed between the first fixing member 11 and the circuit board 3.

The second fixing member 12 presses and fixes the smoothing capacitors 4 to the housing 7. The second fixing member 12 has a flat plate shape and is made of an electric conductive material such as aluminum or iron. The second fixing member 12 supports the circuit board 3 together with the first fixing member 11. The second fixing member 12 preferably has an elastic force like a leaf spring, and reliably fixes the smoothing capacitors 4 by having the elastic force. It is to be noted that second bosses 12A are disposed between the second fixing member 12 and the circuit board 3. The second fixing member 12 is disposed on the same plane as the first fixing member 11. That is, a height of each of the first bosses 11A and a height of each of the second bosses 12A are substantially the same.

It is to be noted that, in FIG. 1, although the power module 2 and the smoothing capacitor 4, the first fixing member 11 and the second fixing member 12, and the circuit board 3 are arranged in this order from the bottom in the drawing, the order is irrelevant to a direction of gravity. That is, any direction in FIG. 1 may be set as the direction of gravity.

According to the first embodiment described above, the following effects are obtained.

(1) The power conversion device 1 includes the power modules 2 that perform the switching operation, the smoothing capacitors 4 that smooth the voltage ripples caused by the switching operation, the circuit board 3 that controls driving of the power modules 2, the housing 7 that accommodates the power modules 2 and the smoothing capacitors 4, the first fixing member 11 that fixes the power modules 2 to the housing 7, and the second fixing member 12 that fixes the smoothing capacitors 4 to the housing 7. The circuit board 3 straddles between the power modules 2 and the smoothing capacitors 4 and is fixed by the first fixing member 11 and the second fixing member 12. As described above, since the first fixing member 11 and the second fixing member 12 fix not only the circuit board 30 but also other configurations, a dimension in a height direction of the power conversion device 1, more strictly, a dimension in a thickness direction of the circuit board 3 in the power conversion device 1 is reduced.

(2) In the power conversion device 1, the first fixing member 11 and the second fixing member 12 are disposed on the same plane. Therefore, heights of the first boss 11A and the second boss 12A are minimized, and the circuit board 3 is stably supported.

(3) The power conversion device 1 includes the bus bar 5 that electrically connects the power modules 2 and the smoothing capacitors 4. The bus bar 5 is disposed on the same plane as the first fixing member 11 and the second fixing member 12. Therefore, the dimension in the height direction of the power conversion device 1 is reduced.

(4) The power conversion device 1 includes the channel forming bodies 6 each of which forms flow channels of the cooling medium for cooling the power modules 2. The channel forming bodies 6 are fixed to the housing 7 by the first fixing member 11 together with the power modules 2. Therefore, since it is not necessary that a fixing member should be added to provide the flow channel for the cooling medium, the dimension in the height direction of the power conversion device 1 is kept small.

(5) The first fixing member 11 and the second fixing member 12 are made of the electric conductive material. Therefore, the first fixing member 11 and the second fixing member 12 serve as electromagnetic shielding and grounding due to the electric conductivity thereof, and noise generated by the power modules 2 and the smoothing capacitors 4 is interrupted from the circuit board 3.

(6) The first fixing member 11 and the second fixing member 12 have the elastic force. Therefore, the power modules 2 and the smoothing capacitors 4 are firmly fixed to the housing 7.

(First Modification)

Figure 3:
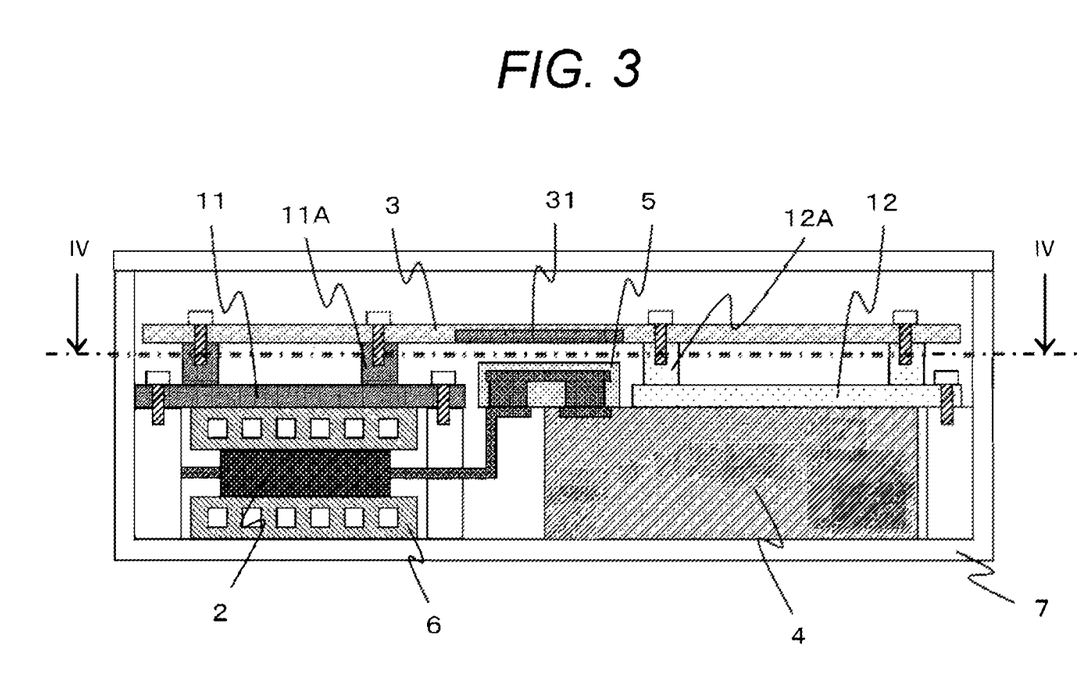
FIG. 3 is a cross-sectional view of the power conversion device 1 according to a first modification.

FIG. 3 is a cross-sectional view of the power conversion device 1 according to a first modification. FIG. 3 corresponds to FIG. 1 in the first embodiment. In the present modification, the circuit board 3 includes a shield layer 31. The shield layer 31 is a conductive layer inside the circuit board 3, and has a potential of ground or floating.

Figure 4:
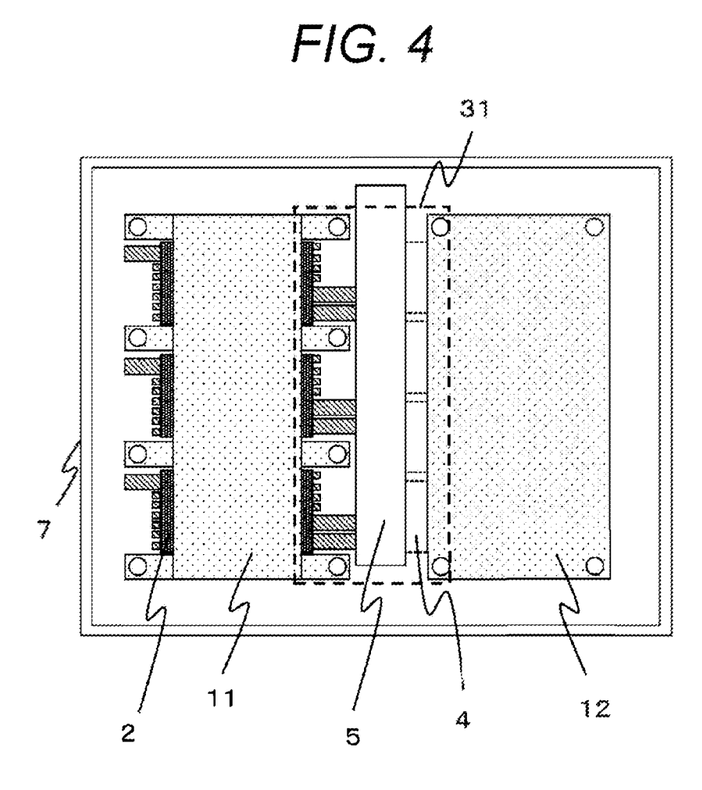
FIG. 4 is a cross-sectional view taken on line IV-IV in FIG. 3.

FIG. 4 is a cross-sectional view illustrating a cross section taken on line IV-IV in FIG. 3, and corresponds to FIG. 2 in the first embodiment. It is to be noted that, in FIG. 4, a position of the shield layer 31 is indicated by a broken line. As illustrated in FIGS. 3 and 4, the shield layer 31 is disposed between the first fixing member 11 and the second fixing member 12. Therefore, noise passing between the first fixing member 11 and the second fixing member 12 is interrupted.

According to the first modification, the following effect is obtained in addition to the effects in the first embodiment.

(7) The circuit board 3 is provided with the shield layer 31 that is the conductive layer. The shield layer 31 is disposed between the first fixing member 11 and the second fixing member 12. Therefore, the noise leaking from between the first fixing member 11 and the second fixing member 12 is interrupted by the shield layer 31. It is to be noted that a member susceptible to the noise may be disposed right above the first fixing member 11 or the second fixing member 12 instead of providing the shield layer 31.

(Second Modification)

Figure 5:
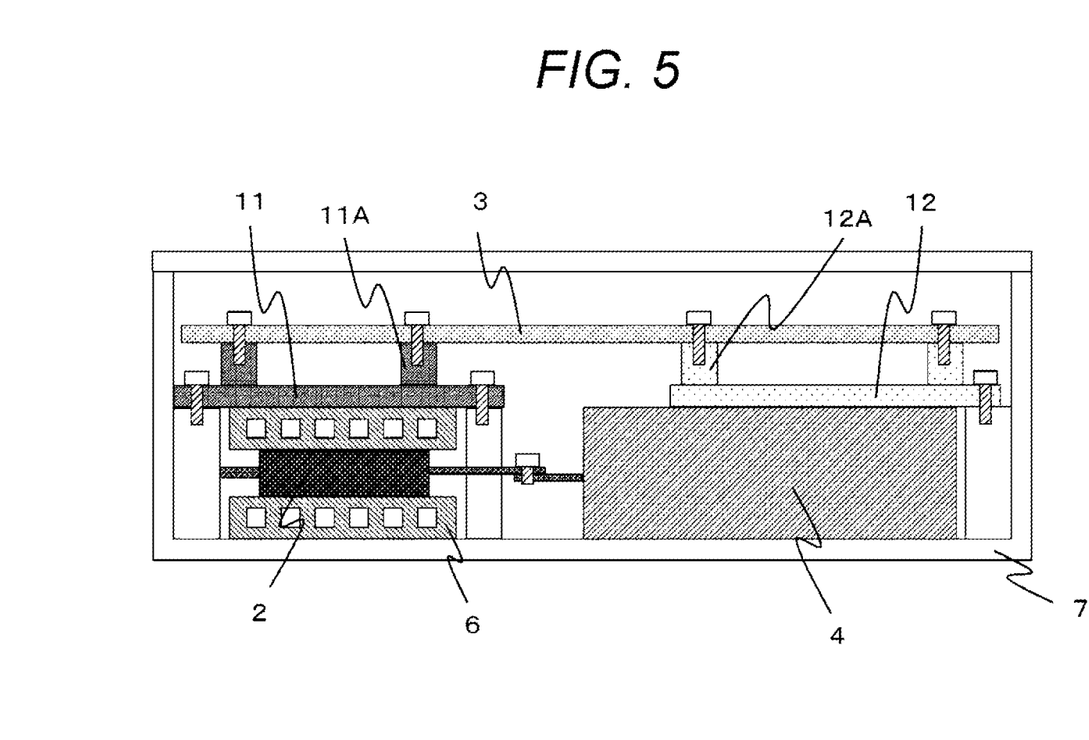
FIG. 5 is a cross-sectional view of the power conversion device 1 according to a second modification.

FIG. 5 is a cross-sectional view of the power conversion device 1 according to a second modification. As illustrated in FIG. 5, the power conversion device 1 may not include the bus bar 5. In this case, the power modules 2 and the smoothing capacitors 4 may be directly connected as illustrated in FIG. 7, for example.

(Third Modification)

Figure 6:
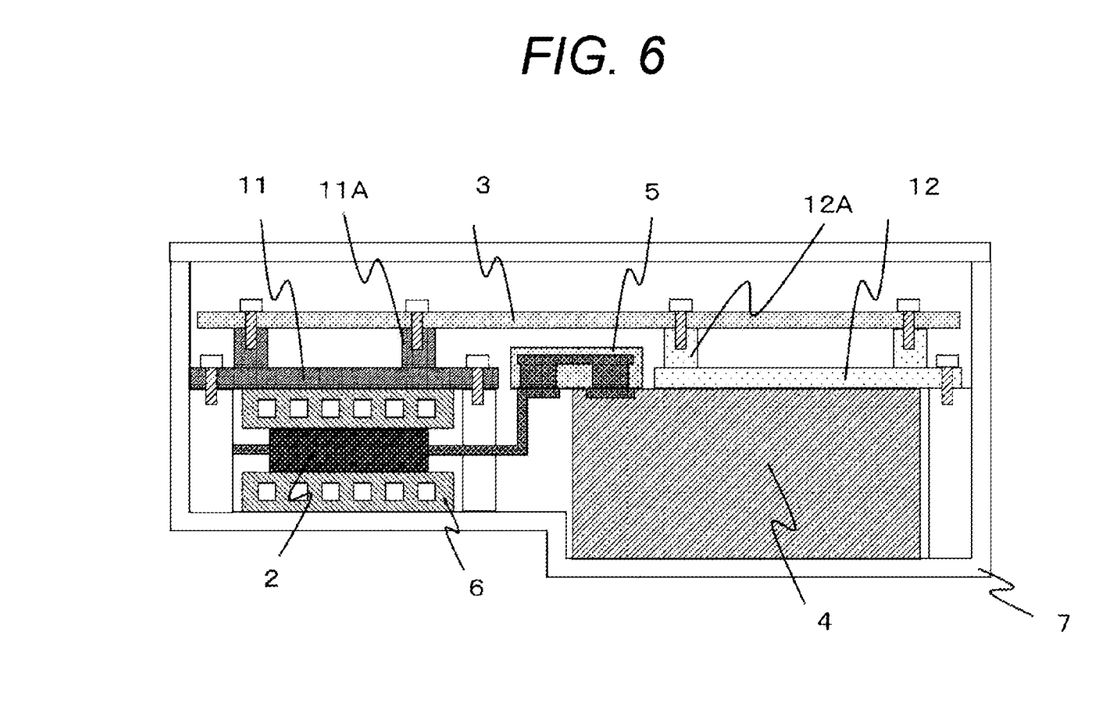
FIG. 6 is a cross-sectional view of the power conversion device 1 according to a third modification.

FIG. 6 is a cross-sectional view of the power conversion device 1 according to a third modification. When the sum of heights of the power module 2 and the channel forming body 6 does not coincide with a height of the smoothing capacitor 4, it is desirable that the first fixing member 11 and the second fixing member 12 are disposed on the same plane by providing a step at a bottom portion of the housing 7 as illustrated in FIG. 6. For example, it is conceivable that the bottom portion of the housing 7 is flattened without any particular device, and lengths of the first boss 11A and the second boss 12A are made different from each other to deal with the situation. However, it is not preferable to do so, because the boss becomes long, and a problem occurs in stable holding of the circuit board 3 in that case.

(Other Modifications)

In the above-described embodiment, the first fixing member 11 and the second fixing member 12 have the elastic force. It is to be noted that it is not essential for the first fixing member 11 and the second fixing member 12 to have the elastic force, and at least one of the first fixing member 11 and the second fixing member 12 may not have the elastic force.

In the above-described embodiment, the first fixing member 11 and the second fixing member 12 have the electric conductivity. It is to be noted that it is not essential for the first fixing member 11 and the second fixing member 12 to have the electric conductivity, and at least one of the first fixing member 11 and the second fixing member 12 may not have the electric conductivity.

In the above-described embodiment, the power conversion device 1 includes the channel forming bodies 6. It is to be noted that the channel forming bodies 6 are not essential components of the power conversion device 1, and the power conversion device 1 may not include the channel forming body 6. In that case, in the power conversion device 1, the power modules 2 may be brought into close contact with the bottom portion of the housing 7, or a metal having a high thermal conductivity may be interposed between the power modules 2 and the housing 7.

The above-described embodiment and modifications may be combined. While various embodiment and modifications have been described above, the present invention is not limited to the above configurations. It is to be understood that other aspects conceivable within the scope of the technical idea of the present invention are also included within the scope of the present invention.

REFERENCE SIGNS LIST

1 power conversion device
2 power module
3 circuit board
31 shield layer
4 smoothing capacitor
5 bus bar
6 channel forming body
7 housing
11 first fixing member
12 second fixing member

The invention claimed is:

1. A power conversion device comprising:
   a power module that performs switching operation;
   a smoothing capacitor that smooths a voltage ripple caused by the switching operation;
   a circuit board that controls driving of the power module;
   a housing that accommodates the power module and the smoothing capacitor;
   a first fixing member for fixing the power module to the housing; and
   a second fixing member for fixing the smoothing capacitor to the housing, wherein
   the circuit board straddles between the power module and the smoothing capacitor, and is fixed by the first fixing member and the second fixing member, and
   at least one of the first fixing member and the second fixing member is made of an electric conductive material.

2. The power conversion device according to claim 1, wherein the first fixing member and the second fixing member are disposed on the same plane.

3. The power conversion device according to claim 2, wherein
   the power conversion device further comprises a bus bar that electrically connects the power module and the smoothing capacitor, and
   the bus bar is disposed on the same plane as the first fixing member and the second fixing member.

4. The power conversion device according to claim 1, wherein
   the power conversion device further comprises a channel forming body that forms a flow channel of a cooling medium for cooling the power module, and
   the channel forming body is fixed to the housing together with the power module by the first fixing member.

5. The power conversion device according claim 1, wherein
   the first fixing member and the second fixing member are made of the electric conductive material,
   a shield layer that is an electric conductive layer is provided on a surface of the circuit board, and
   the shield layer is disposed between the first fixing member and the second fixing member.

6. The power conversion device according to claim 1, wherein at least one of the first fixing member and the second fixing member has an elastic force.

* * * * *